(12) United States Patent
Ramaswami et al.

(10) Patent No.: US 7,650,550 B2
(45) Date of Patent: Jan. 19, 2010

(54) OVER TEMPERATURE DETECTION APPARATUS AND METHOD THEREOF

(75) Inventors: Ravi Ramaswami, Austin, TX (US); Michael D. Bienek, Austin, TX (US)

(73) Assignee: GlobalFoundries Inc.

( * ) Notice: Subject to any disclaimer, the term of this patent is extended or adjusted under 35 U.S.C. 154(b) by 246 days.

(21) Appl. No.: 11/679,242

(22) Filed: Feb. 27, 2007

(65) Prior Publication Data

US 2008/0209291 A1    Aug. 28, 2008

(51) Int. Cl.
*G01R 31/3177* (2006.01)
*G01R 31/40* (2006.01)

(52) U.S. Cl. .......... 714/731; 714/724
(58) Field of Classification Search ................ None
See application file for complete search history.

(56) References Cited

U.S. PATENT DOCUMENTS

| | | | |
|---|---|---|---|
| 4,661,953 A * | 4/1987 | Venkatesh et al. | 714/42 |
| 5,422,832 A | 6/1995 | Moyal | 364/557 |
| 5,448,725 A * | 9/1995 | Gervais | 714/47 |
| 5,457,802 A * | 10/1995 | Catherwood et al. | 713/320 |
| 5,629,643 A * | 5/1997 | Moughanni et al. | 327/199 |
| 5,961,215 A | 10/1999 | Lee et al. | 374/178 |
| 6,065,145 A * | 5/2000 | Bencivenga | 714/724 |
| 6,157,244 A | 12/2000 | Lee et al. | 327/539 |
| 6,567,763 B1 | 5/2003 | Javanifard et al. | 702/130 |
| 6,811,309 B1 | 11/2004 | Ravishanker | 374/178 |
| 7,006,943 B1 | 2/2006 | Mitchell et al. | 702/132 |
| 7,378,831 B1 * | 5/2008 | Jenkins et al. | 324/76.11 |
| 2004/0008754 A1 | 1/2004 | Clabes et al. | 374/183 |
| 2006/0227596 A1 | 10/2006 | Thayer | 365/154 |
| 2007/0002990 A1 * | 1/2007 | Lee et al. | 375/355 |

FOREIGN PATENT DOCUMENTS

JP    10097561 A  *  4/1998

* cited by examiner

*Primary Examiner*—Kevin L Ellis
*Assistant Examiner*—Dipakkumar Gandhi (57) ABSTRACT

A device is provided for detecting temperature-induced delays in a combinational logic path. A signal at the output of the logic path is latched at a first latch using a primary clock signal. The primary clock signal is delayed by a delay element to provide a delayed clock signal. The output of the logic path is latched at a second latch using the delayed clock signal. The delay element delays the clock signal by an amount that indicates the occurrence of an over-temperature condition at the logic path. A comparator compares the data latched at the first latch to the data latched at the second latch and provides an error signal indicative of an over-temperature condition if the first and second latch contain different data values.

20 Claims, 5 Drawing Sheets

OVER TEMPERATURE DETECTION APPARATUS AND METHOD THEREOF

BACKGROUND

1. Field of the Disclosure

The present disclosure relates generally to integrated circuits, and more particularly to detecting failures at the integrated circuit.

2. Description of the Related Art

It is well understood that integrated circuits can operate over a wide range of temperatures and process variations. As a result, integrated circuits are generally designed to operate for worst case scenarios across all possible variations. With respect to temperature variations, transistors tend to switch more slowly at higher temperatures. In order to facilitate an understanding of various speed paths at portions of an integrated circuit, the use of arrayed diodes have been implemented whereby the current changes at the diodes is a function of temperature which can be monitored external the integrated circuit. An additional method of monitoring on-chip temperature can be accomplished though the use of ring oscillators whereby output frequency changes as a function of temperature and can be monitored external the device. However, such ring oscillators require calibration at multiple temperatures before they can be accurately used. In devices where reliability is sufficiently critical, circuits can be mirrored in order to determine that the mirrored circuits are both operating in a similar manner by monitoring the obtained results. Even with these techniques, the possibility of a failure occurring that goes undetected is possible, as is the possibility of a detected error occurring for an unknown reason. Therefore, a method and device overcoming these problems would be useful.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

Figure 1:
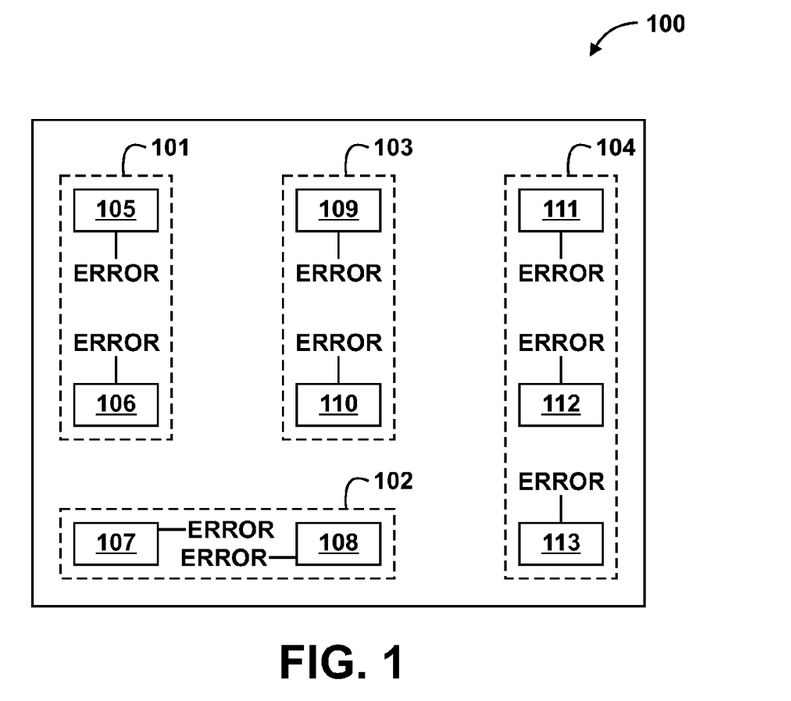
FIG. 1 is a top view of an integrated circuit (IC) illustrating regions and diagnostic logic portions according to one embodiment.

FIG. 1 illustrates an integrated circuit device 100 having operational blocks 101, 102, 103, and 104. Examples of operational blocks include data processors, such as, central processing units, floating-point processing units, integer processing units, and the like. The operational blocks can also include memory such as static RAM, dynamic RAM (DRAM), non-volatile memory and volatile memory, and the like; input/output functional modules; and similar operational blocks. The term "native" as used herein with respect to the integrated circuit device 100 refers to the intended functionality of the device relative to an end user. Therefore, native logic with respect to the integrated circuit device 100 would be that logic which implements the end functions as used by the user. For example, logic implementing an adder with respect to a central processing unit will be considered native logic. As used herein with respect to the integrated circuit device 100, the term "diagnostic logic", refers to logic which, while useful in determining whether or not the native logic may be working, does not effect the native operation of the integrated circuit device 100.

It will be appreciated that the operational blocks 101-104 can operate in such a manner to cause temperature variations across the integrated circuit 100. For example, if operational block 101 operates such that the majority of its transistors are switched at near the maximum frequency of the integrated circuit 100, more current will be dissipated by operational block 101 causing its temperature to be higher than another block, such as, for example operational block 102, which may have a smaller portion of its transistors switching, and those transistors may be switching at a slower rate. In order to monitor the operation of the operational blocks 101-104 to determine the effects of temperature locally, diagnostic logic portions 105-113 have been added to the operational blocks 101-104.

For example, referring to operational block 101, a diagnostic logic portion 105 and a diagnostic logic 106 portion have been added. The diagnostic logic portions 105 and 106 do not effect the native operation of the block 101. In accordance with one embodiment, the diagnostic logic portion 105 "piggy-backs" on top of the native logic of the operation block 101. In accordance with a specific embodiment to the present disclosure, the diagnostic logic 105 receives and delays a clock signal used by the native logic in such a manner to attempt to latch the native logic data signal within the diagnostic logic. By comparing the signal latched within the diagnostic logic circuitry to a corresponding signal latched within the native circuitry, it can be determined whether or not it is likely that a timing error has occurred within the native logic portion of the operational unit 101 due to over-temperature conditions. In accordance with a specific embodiment, the error signal is latched at a "sticky latch", whereby the term "sticky latch", as used herein, is meant to refer to a latch that once set at a particular state (a sticky state), will maintain the sticky state until explicitly reset by reset logic of the latch. Accordingly, once an error condition causes a sticky state to occur at the sticky latch, a subsequent removal of the error condition will not cause the sticky latch to transition from the sticky state. In this manner, once an error causes a sticky state to be latched, the error signal remains latched, as part of the sticky state, to assure recognition of the error condition.

By implementing the diagnostic logic blocks 105-113 across various portions of the integrated circuit, it is possible to detect the effects of temperatures at different locations of the integrated circuit, and at each location, the diagnostic logic can provide real-time detection of the effects of temperature at every clock cycle. Specific implementations of diagnostic logic blocks 105-113 will be better understood with respect to FIGS. 2 through 7 below.

Figure 2:
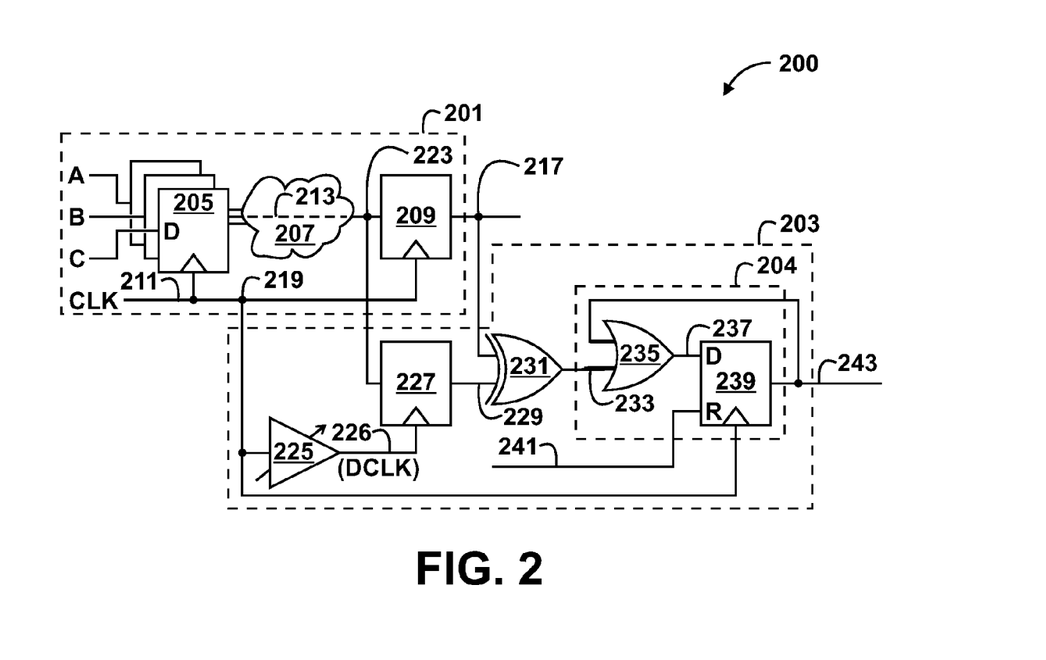
FIG. 2 is a diagram of a detection circuit according to one embodiment.

FIG. 2 illustrates a portion 200 of the integrated circuit 100 of FIG. 1. The portion 200 includes a native logic portion 201, and a diagnostic logic portion 203. The native logic portion 201 includes one or more latches 205 that receive data represented by logic signals (A-C) and provide latched representations of these signals to a native combinational logic portion 207. The native combinational logic portion 207 includes a plurality of delay paths through combinational logic, including a delay path 213, which includes generation of a logic signal at the node 223. Node 223 is connected to the data input of latch 209 which latches data in response to data being latched at latch 205. The native logic portion 201 further includes a clock signal 211 which is received at the one or more latches 205 and latch 209.

The diagnostic logic portion 203 receives the clock signal 211 from the native logic portion 201 and delays it by a determined amount at delay element 225 to provide a delayed clock signal (DCLK) at node 226. The delay element 225 can implement a fixed delay or have a variable delay that can be set by external components or programmed by a user through a register, which can be part of the integrated circuit's programmer's model. The delayed clock signal at node 226 latches data at a latch 227 that is received at node 223 from the native logic portion 201. An exclusive OR gate (XOR) 231 has an input connected to the output node 217 of latch 209 and has input connected to the output node 229 of latch 227. An output node 233 of the XOR gate 231 is provided to the input of a sticky latch 204. A specific embodiment of the sticky latch 204 comprises an OR gate 235 and a latch 239. The OR gate has an output node 237 connected to the data input of the latch 239. The latch 239 also includes a reset input connected to a node 241, a clock input connected to the clock signal 211, and an output at node 243. The output at node 243 is fed back to another input of the OR gate 235 to allow the combination of latch 239 and the OR gate 235 to operate as a sticky latch.

During operation, data represented by a logic signal is propagated through the native combinational logic portion 207, to the data inputs of latches 209 and 227. The data needs to arrive at the native latch 209 sufficiently in advance of a latching edge of the clock signal 211 in order to meet a setup time required by the latch 209. Respectively, the data needs to arrive at the diagnostic latch 227 sufficiently in advance of a latching edge of the delayed clock signal (DCLK) at node 226 in order to meet a setup time required by the latch 227. As temperature increases, data propagates along the delay path 213 at a relatively slower rate than the latching edge of the clock signal 211, and as such the data may be delayed sufficiently to arrive at latch 209 after the setup time, which results in data failing to be latched properly at latch 209.

It will be appreciated, that even if latch 209 is failing to latch data and ultimately causing a failure in the transfer of data, the data arriving at node 223 can be latched properly into latch 227 of the diagnostic logic portion 203 since the clock signal (DCLK) latching data at latch 227 is delayed from the clock signal 211 latching data at latch 209, thereby providing extra setup time margin at latch 227. Therefore, in such conditions, a failure to latch data at latch 209 would not result in a failure to latch the data at latch 227. This difference in latched values will be detected by the XOR gate 231 which would assert a logic-high signal at its output, causing a sticky state at the sticky latch 204 to be asserted. Assertion of the sticky state at sticky latch 204 indicates an error occurred.

Figure 3:
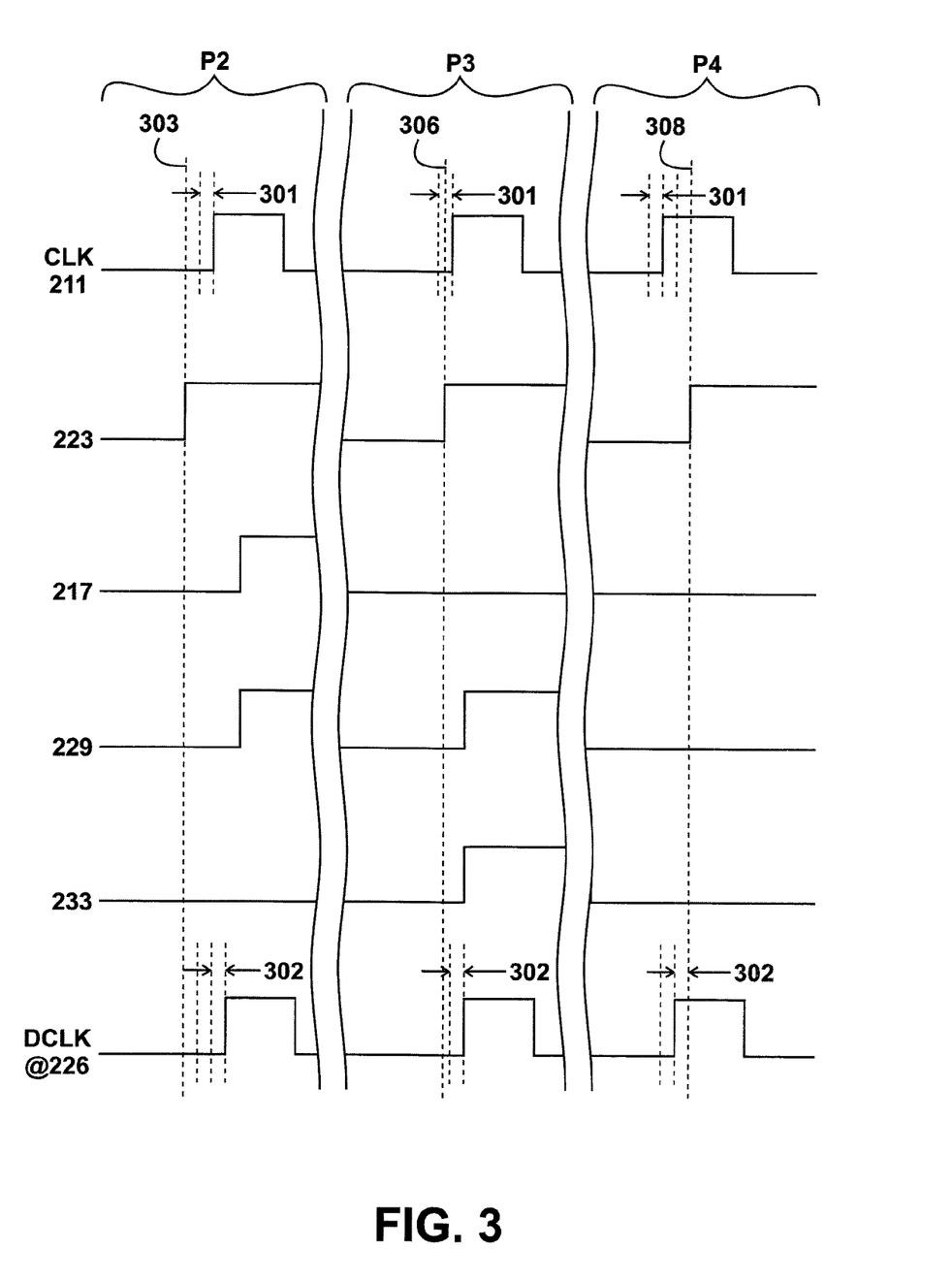
FIG. 3 is a timing diagram illustrating particular signals of components within the detection circuit according to one embodiment.

By implementing the diagnostic logic portion 203 in the manner illustrated in FIG. 2, it is possible to detect when failures within native logic portion 201 occur. This will be better understood with reference to the timing diagram of FIG. 3. FIG. 3 illustrates a clock signal 211 at node 219, a logic signal at node 223, a logic signal at node 217, a logic signal at node 229, a logic signal at node 233, and a delayed clock signal (DCLK) at node 226. For purposes of illustration, it is assumed that the clock signal 211 is not affected by temperature changes, relative to the delay path 213 through the native combinational logic portion 207. The edge 303 of the logic signal at node 223 during period P2 is illustrated as arriving in advance of the rising edge of the clock signal 211, and particularly before the required setup time 301. As a result, at the rising edge of the clock signal 211 at period P2, the data at node 223 is latched as a high voltage logic signal (logic-high signal) at the output node 217 as expected. Similarly, the logic signal at node 223 arrives at the diagnostic latch 227 sufficiently in advance of the setup time 302 required by the delayed clock signal (DCLK) at node 226, and the data at node 223 is latched as a logic-high signal at latch 227 of the diagnostic logic portion 203. Notably, the data stored at latch 227, is the same data stored at latch 209 as indicated by the logic signals at nodes 217 and 229. It will be appreciated that while according to this embodiment the latches are illustrated as edge sensitive, the latches could also be level sensitive.

Referring again to FIG. 3, the timing diagram in period P3 illustrates the detection of an error as a result of increasing temperature affecting operation of the circuit. Specifically illustrated, the edge 306 of the logic signal being propagated at node 223 to latch 209 is illustrated to violate the required setup time 301 of latch 209. As a result, the data fails to latch within the latch 209 and the output logic signal at node 217 is a logic-low signal. However, because the delayed clock signal (DCLK) at node 226 has been delayed, there is an extra setup time margin available to latch the data at node 223 at latch 227. Therefore, the data change at node 223 during period P3 arrives at the data input of latch 227 prior to the required setup time 302 and therefore data is properly latched at the latch 227. The latch 227 outputs a logic-high signal and the result is that the XOR gate 231 detects a difference in data at its inputs and asserts a logic-high signal at node 233 indicating the occurrence of an error. It will be appreciated, that in the illustrated embodiment, this data is latched as a logic-high signal in the sticky latch 204, which indicates a sticky state of the sticky latch 204, which is indicative of an error. The sticky state of the sticky latch 204 is maintained until explicitly reset by the assertion of a signal at node 241. It will be appreciated, that typically a user, after acknowledgment of the error, could provide a signal to the sticky latch 204 to clear the sticky state indicated by the error indicator signal. The assertion of the error indicator signal can initiate an active operation, such as an interrupt operation, or alternatively, the error indicator signal may be accessible at a register address that can be read, allowing a user to poll the integrated circuit to determine if an error has occurred.

In further reference to FIG. 3, period P4 indicates a failure mechanism which may not be detected if the over-temperature conditions occur too rapidly. Specifically, as previously discussed, the edge 308 of the logic signal at node 223 arrives late, relative to the clock signal 211, particularly arriving in violation of the setup time 301. Additionally, the edge 308 of the logic signal at node 223 has been delayed such that it arrives at latch 227 after setup time 302, thereby failing to latch at 227. Since both of these mechanisms have failed at the same time, the XOR gate 231 will not detect this as an error. Therefore, it will be appreciated, that the variable delay element 226 is selected such that it provides a clock signal delay greater than an expected worst-case-scenario delay of a logic-signal through the delay path, thereby facilitating detection of substantially all delays caused by over-temperature conditions.

Figure 4:
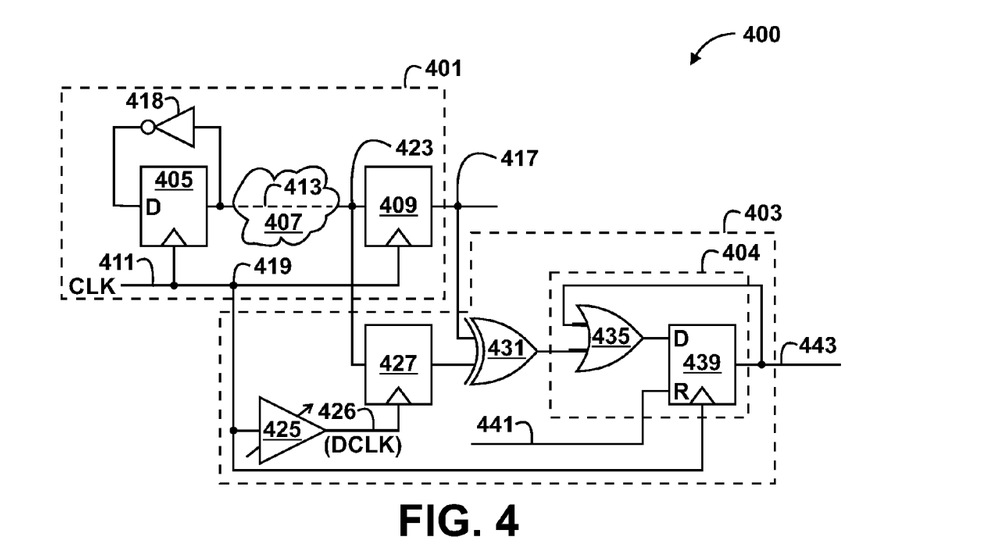
FIG. 4 is a diagram of a detection circuit according to one embodiment.

Referring to FIG. 4, a device 400 is illustrated which does not rely upon the use of a native logic portion, but instead, illustrates an alternative embodiment, that replaces the native logic portion 201 of the FIG. 2, with a diagnostic portion 401, which is useful as a stand-alone diagnostic tool. The diagnostic portion 401 includes a latch 405, an inverter 418, a combinational logic portion 407, a latch 409, and nodes 417, 419, and 423. The latch 405 includes an input, an output, and a clock input connected to the clock signal 411. The combinational logic portion 407 includes an input connected to the output of the latch 405, and a delay path 413 which can propagate a logic signal to the node 423 via an output. The latch 409 includes an input connected to the node 423, an output connected to a node 417, and a clock input connected to the clock 411. The inverter 418 has an input connected to the output of the latch 405 and the output connected to the input of the latch 405. It will be appreciated that such an arrangement between the inverter 418 and the latch 405 facilitates toggling of the data input to the latch 405 such that a different logic state is latched at every new clock cycle, creating a diagnostic portion 401 having stand-alone diagnostic device capabilities. Moreover, it will also be appreciated that the delay path 413 of the combinational logic portion 407 can be representative of a worst-case delay, either for the region of interest or for the device.

The diagnostic logic portion 403 includes a delay element 425, a latch 427, an exclusive OR (XOR) logic gate 431, and a sticky latch 404 which includes an OR logic gate 435, and a latch 439. The delay element 425 can include fixed or variable delay elements, particularly user-programmable delay elements, and has a clock input connected to the node 419 such that it receives the clock signal 411 during operation, and an output. The latch 427 includes an input connected to the node 423, an output, and a clock input connected to the output of the delay element 425, to receive a delayed clock signal (DCLK) at node 426. The XOR gate 431 includes a first input connected to the node 417, a second input connected to the output of the latch 427, and an output. The OR gate 435 of the sticky latch 404 includes a first input, a second input connected to the output of the XOR gate 431, and an output. The latch 439 includes a first input connected to the output of the OR gate 435, a output connected to a node 443, and a clock input connected to the node 419 of the portion 401. The latch 439 further includes a reset input connected to a node 441. The output at node 443 is fed back to the first input of the OR gate 435 to allow the combination of the latch 439 and the OR gate 435 to operate as a sticky latch.

The operation of device 400 is substantially similar to the operation of the device illustrated in FIG. 2, however the device 400 is particularly designed to operate as a stand-alone diagnostic device. Accordingly, during operation, data represented by a logic signal is propagated through the diagnostic portion 401 as it would be propagated through the native logic portion 201 as described above. As such, data is propagated through components 405, 413, and 409 which correspond to and operate in the same manner as the components 205, 207, and 209 as described previously, with the exception of the configuration of the latch 405 and the inverter 418 as mentioned above. Moreover, data propagates through the diagnostic logic portion 403 in the same manner as data propagates through the diagnostic logic portion 203 as previously described in accordance with FIG. 2. As such, the components 425, 427, 431 and 404 correspond and operate in the same manner as components 225, 227, 231, and 204 described in accordance with FIG. 2. Therefore, during operation, if data is significantly delayed within the diagnostic portion 401 such that it is not latched in latch 409, the components of the diagnostic logic portion 403 can latch the data due to a delayed clock signal (DCLK) and assert an error indicator signal at the output of the sticky latch 403 to indicate the data failing to latch at latch 409. As will be appreciated, the delay of the clock signal at the delay element 425 of the diagnostic logic portion 403 can be representative of a delay caused by a worst-case scenario change in temperature.

Figure 5:
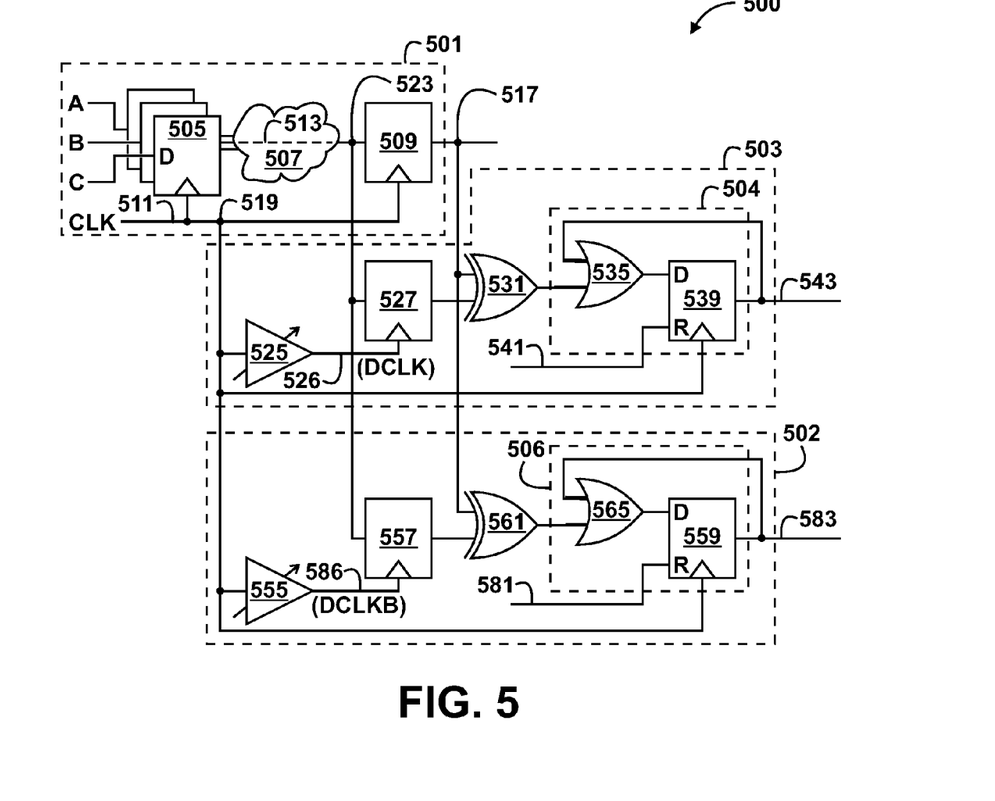
FIG. 5 is a diagram of a detection circuit according to one embodiment.

Referring to FIG. 5, a device 500 is illustrated which includes a native logic portion 501, a first diagnostic logic portion 503, and a second diagnostic logic portion 502. The native logic portion 501 operates in the same manner as the native logic portion 201 illustrated and discussed in accordance with FIG. 2. As such, the native logic portion 501 includes one or more latches 505, a native combinational logic portion 507, nodes 517, 519, and 523, and a latch 509. These components correspond to and operate in the same manner as elements 205, 207, 217, 219, 223, and 209 illustrated and discussed in accordance with FIG. 2.

The first diagnostic logic portion 503 operates in the same manner as the diagnostic logic portion 203 illustrated and discussed in accordance with FIG. 2. The first diagnostic logic portion 503 includes a delay element 525, a latch 527, a XOR gate 531, a sticky latch 504 including an OR gate 535, and a latch 539, which correspond to and operate in the same manner as elements 225, 227, 231, 204, 235, and 239 illustrated and discussed in accordance with FIG. 2.

The second diagnostic logic portion 502 operates in the same manner as the diagnostic logic portion 203 illustrated and discussed in accordance with FIG. 2. The second diagnostic logic portion 502 includes a delay element 555, a latch 557, a XOR gate 561, sticky latch 506 including an OR gate 565, and a latch 559. These components correspond to and operate in the same manner as elements 225, 227, 231, 204, 235, and 239 illustrated and discussed in accordance with FIG. 2.

Accordingly, the operation of the device 500 is similar to the operation of the device 200 illustrated in FIG. 2, with the addition of the second diagnostic logic portion 502. During operation, data in the form of a logic signal is propagated through the delay path 513 of the native combinational logic portion 507 and to the input of the latch 509. As described previously, the logic signal needs to arrive at the latch 509 sufficiently in advance of a latching edge of the clock signal 511 in order to meet a setup time required by the latch 509. If the data is delayed sufficiently, such as due to a change in temperature, the data may arrive after the setup time of the latch 509, which results in data failing to be latched properly.

As described in accordance with previous embodiments, the logic signal at node 523 is propagated to latch 509, as well as latches within the diagnostic logic portions 503 and 505. According to the embodiment illustrated in FIG. 5, the logic signal at node 523 is propagated to the latch 527 of the first diagnostic logic portion 503 as well as the latch 557 of the second diagnostic logic portion 502. If the logic signal at node 523 fails to latch properly at latch 509 due to a delay caused by, for example, over-temperature conditions, the logic signal at node 523 may be properly latched at latch 527. In such instances, proper latching of the data at node 523 into the latch 527 depends upon the magnitude of the delay of the data relative to the clock signal 511, and the delay of the clock signal 511 provided by the delay element 525. When the data is not latched at latch 509 but is latched properly at latch 527, the latch 527 outputs a logic signal which is propagated to the XOR gate 531 which would assert a logic-high signal. The logic-high signal would then be propagated to the sticky latch 504 where it would set a sticky state. Upon the next clock cycle, the sticky latch 504 can output an error indicator signal, indicating the data was not properly latched at latch 509.

Moreover, in such a case where a signal at node 523 is not properly latched at latch 509, but is latched properly at latch 527, the signal may also be properly latched at latch 557 depending upon the magnitude of the delay of the clock signal 511 caused by the delay element 555 and the delay of the data at node 523. In such instances where the data is not properly latched at latch 509 but is properly latched at the latch 557 of the second diagnostic logic circuit 504, the logic signal is propagated in the same manner as a logic signal through the first diagnostic logic portion 503. As such, the data is propagated to the XOR gate 561 and asserted as a logic-high signal to the sticky latch 506. The logic-high signal is stored in the sticky latch 506 as a sticky state and can be output as an error indicator signal, indicating the failure of the data to latch at latch 509 but properly latching at latch 557.

According to a particular embodiment, the delay elements 525 and 555 are selected to provide different magnitudes of delays. According to one particular embodiment, the delay element 525 provides a different delay of the clock signal 511 at node 526 than the delay of the clock signal at node 586 caused by delay element 555. Particularly, delay element 555 delays the clock signal for a greater duration than the delay element 525, such that data at node 523 may not be latched at latch 527 of the first diagnostic logics portion 503, however the delay element 555 provides sufficient delay such that data at node 523 is latched at latch 557 of the second diagnostic logic portion 502. Such a configuration facilitates diagnosing delays of varying duration, and notably facilitates diagnosis of the magnitude of the delays of data through the delay path 513. Moreover, diagnosis of such delays within the data path also facilitates evaluation of the combinational logic portion's operational parameters and tolerances, such as the maximum operating frequency and temperature.

For example, during testing, data at node 523 may fail to properly latch at latches 509 and 527, but may properly latch at latch 557. In such instances, the output of the first diagnostic logic portion 503 will not output an error indicator signal as the delay of the data at node 523 was sufficiently long such that the data did not properly latch at the latches 509 and 527. However, given a sufficient delay by the delay element 555, the data is properly latched at the latch 557 and accordingly, an error indicator signal is output by the second diagnostic logic portion 502. Therefore, it is known that the delay provided by the delay element 525 is insufficient, however the delay provided by the delay element 555 is sufficient, and accordingly the magnitude of the delay of the data is known. As a result of this failure signature (i.e., a failure signal at node 583 only) the part being tested can be characterized to the slowest of three possible speed bins (i.e., full speed, medium speed, and slow speed).

Figure 6:
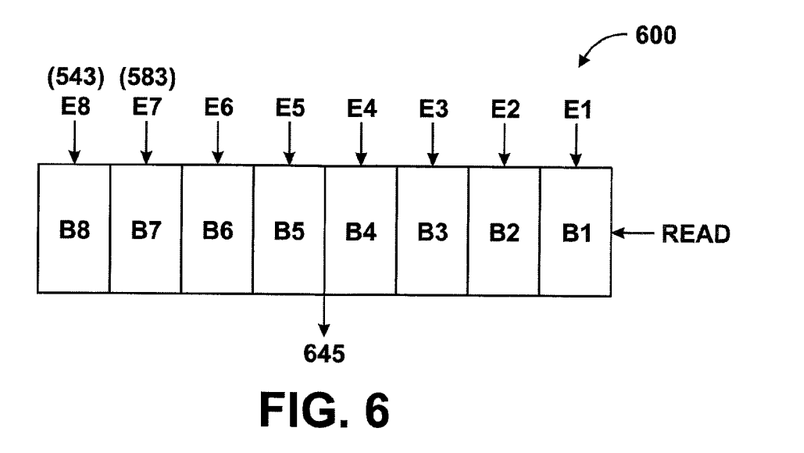
FIG. 6 is a diagram of a register for use with the detection circuit according to one embodiment.

Referring to FIG. 6, a user-readable register 600 is illustrated. The register 600 includes a plurality of locations B1-B8 that can be read by asserting a read indicator signal READ, and an output 645. Notably, the data readable from register locations (B1-B8) corresponds to error indicator signals (E1-E8) asserted by a plurality of sticky latches from a plurality of diagnostic logic portions. According to one embodiment, the register 600 can be read at an address location defined by a programmer's model that asserts the READ signal.

Figure 7:
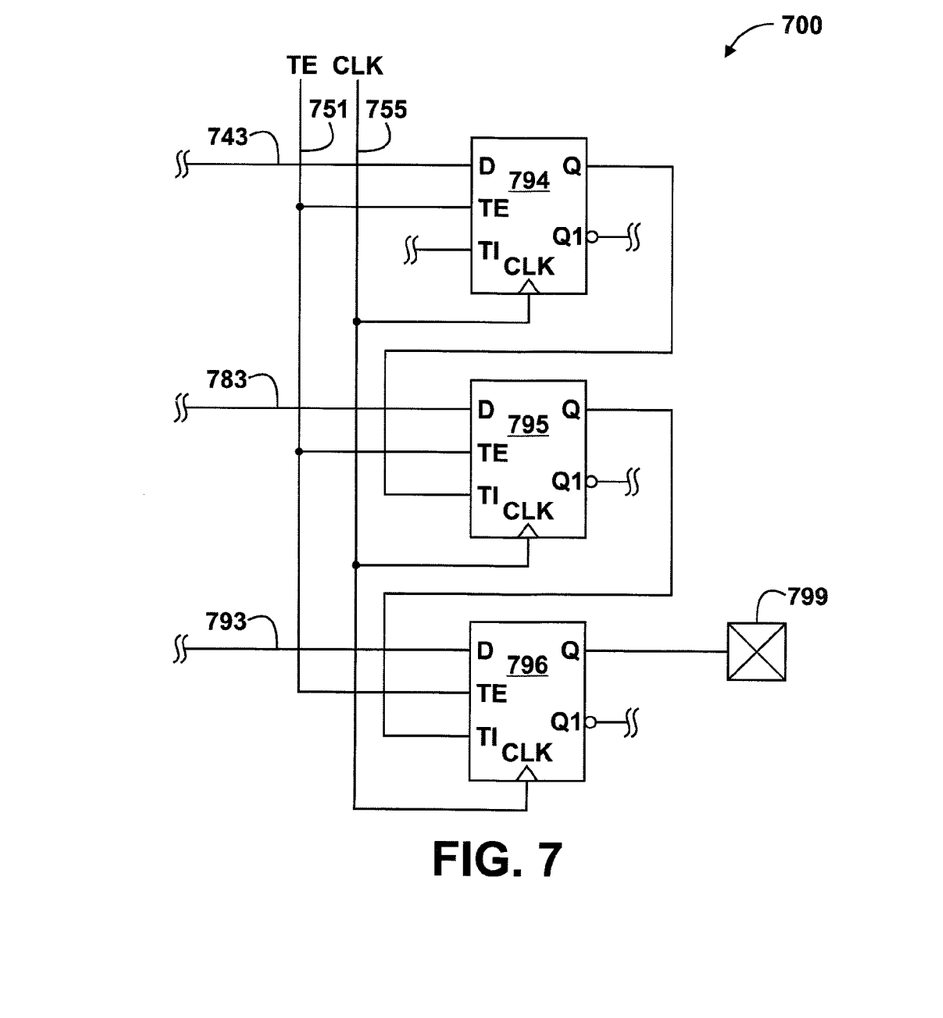
FIG. 7 is a diagram of a scan latch for use with the detection circuit according to one embodiment.

Referring to FIG. 7, a scan latch 700 is illustrated, which includes a plurality of scannable latches each of which can be integrated as part of a sticky latch, such that data output by an OR gate within the sticky latch is latched within a scannable latch. The scan latch includes a latch 794, a latch 795, and a latch 796. Latch 794 includes a data input connected to the node 743 of the diagnostic logic portion illustrated in previous embodiments, and particularly an output of an OR gate within a sticky latch. Latch 794 further includes a test enable input (TE) connected to a test enable signal node 751, a test data input (TI), a clock input (CLK) connected to a clock signal node 755, a first data output (Q), and a second data output (Q1). The latch 795 includes a data input connected to a node 783 of a diagnostic logic portion as illustrated in previous embodiments, and particularly an output of an OR gate within a sticky latch. The latch 795 further includes a test enable input (TE) connected to the test enable signal node 751, a test data input (TI) connected to the first data output of the latch 794, a clock input (CLK) connected to the clock signal node 755, a first data output (Q), and a second data output (Q1). The latch 796 includes a data input connected to a node 793 of a diagnostic logic portion, and particularly an output of an OR gate within a sticky latch. The latch 796 further includes a test enable input (TE) connected to the test enable signal node 751, a test data input (TI) connected to the first data output of the latch 795, a clock input (CLK) connected to the clock signal node 755, a first data output (Q) connected to output pad 799 for output of data to external devices, and a second data output (Q1).

During operation, the latches 794-796 can operate as latches within a sticky latch as described previously in accordance with other embodiments. The latches 794-796 can be placed in a scan mode via the test enable signal 751 such that the scan latch 700 is prepared to serially scan data through the scan chain. Before initiation of a scanning operation, the latch 794 will have latched a data value represented by a logic signal asserted from the node 743 of the diagnostic logic portion. Likewise, the latch 795 has latched a data value asserted from node 783, and the latch 796 has latched a data value asserted from node 793. A scanning operation can be initiated by asserting a signal from the test enable node 751. In the scanning operation, the data stored in each of the latches 794-796 is output via the first output of the latch 796 in a serial manner to downstream circuitry for evaluation, such as by a tester or user.

Figure 8:
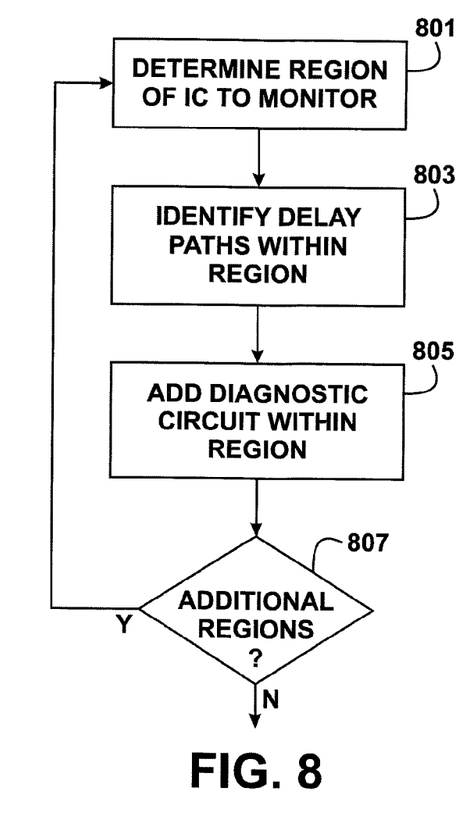
FIG. 8 is a flow chart illustrating steps for implementing a detection circuit on an IC according to one embodiment.

Referring to FIG. 8, a flow chart is illustrated demonstrating a process by which diagnostic circuits can be provided within an integrated circuit. The process is initiated at step 801, by determining a region of the integrated circuit to monitor. Such a region can generally include a region having a high current capacity, and particularly a region having a high concentration of transistors, or a region in which the transistors are often switching. Moreover, the integrated circuit may include more than one region. As such, the process of determining a region of the integrated circuit can also include partitioning of the integrated circuit into distinct large regions and an additional step of determining sub-regions within the large regions to monitor.

The process continues at step 803 by identifying delay paths within the region. The identification of delay paths within a given region can include identifying those pathways along which data is frequently propagated, particularly pathways along which data is propagated through a plurality of logic devices. The delay paths may particularly include pathways that are continuously propagating data, and those having a greater number of transistors and/or other devices which are susceptible to temperature changes. Moreover, for a given region, more than one delay path may be identified.

After identifying the delay paths at 803, the process continues at step 805, which includes adding a diagnostic circuit within the region. Adding the diagnostic circuit can include adding a diagnostic logic portion to the region, and particularly connecting the diagnostic logic portion to combinational logic within the region identified as having a delay path. Addition of the diagnostic circuit facilitates evaluation of the magnitude of a delay of data along a delay path, and particularly facilitates evaluation of the operational parameters and tolerances of the region of the integrated circuit. Such a process can also aid identification and diagnosis of the delay path most susceptible to over-temperature conditions.

After adding the diagnostic circuit at step 805, the process continues with step 807 in which additional regions within the integrated circuit may be identified as those regions which are particularly susceptible to over-temperature conditions. Accordingly, if other regions are identified, the process starts again with step 801. However, if no additional regions are identified, the process may be concluded.

Figure 9:
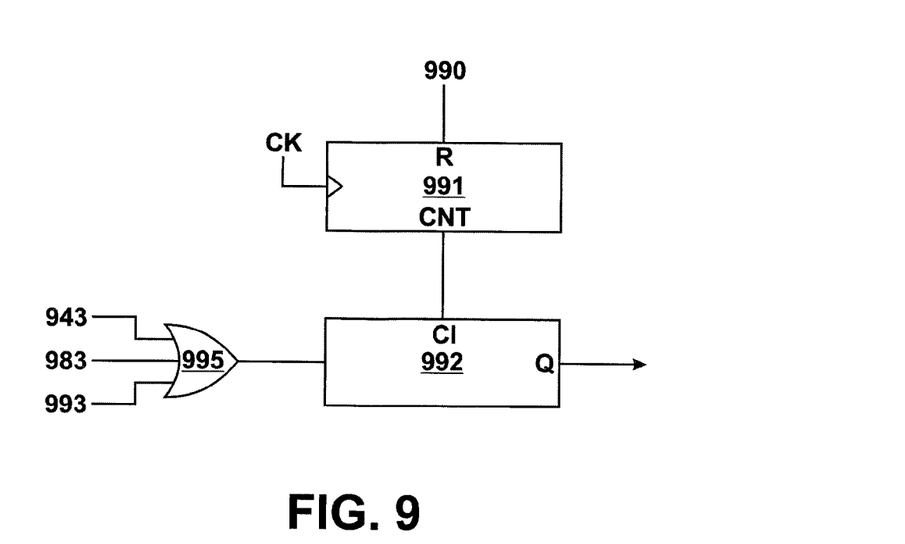
FIG. 9 is a diagram of a counter for use with the detection circuit according to one embodiment.

Referring to FIG. 9, a device 900 is illustrated which includes a counter 791 which can be integrated with one or more sticky latches of diagnostic logic portions to aid evaluation of the time at which an error occurred. As illustrated, the device 900 includes a counter 991, a read/write register 992, and an OR gate 995. The counter 991 includes a reset input (R) to receive a signal from the reset node 990, a clock input, and an output (CNT) to provide a count value. The read/write register 992 includes a counter input (CI) connected to the output (CNT) of the counter 991 to receive the count value, an input to receive data, and an output for propagating the data stored during a read operation. The OR gate 995 includes a plurality of inputs to receive data from the nodes 943, 983, and 993 which are connected to the sticky latches of the diagnostic logic portions as illustrated in previous embodiments, and an output connected to the input of the latch 992.

During operation, the counter 991 can be reset, such as at the beginning of a diagnostic operation. Upon generation of an error signal at one of the sticky latches, a logic-based representation of the error signal can be propagated as data from the sticky latch, to the OR gate 995, and to the read/write register 992 causing the count value to be latched. A user can then initiate a read operation of the read/write register 992 to evaluate the time after the reset operation an error signal occurred. While this embodiment illustrates a single read/write register 992 associated with the plurality of outputs from the sticky latches, it will be appreciated that other embodiments may utilize a single read/write register for each output of each of the sticky latches.

In reference to the embodiments provided herein, detection devices and particularly detection devices having diagnostic logic portions and methods for operating such devices are provided. Particularly, devices and methods are provided which include a combination of features, representing a departure from conventional techniques. The devices and techniques provided herein include utilization of a native logic portion and a diagnostic logic portion. In particular the embodiments utilize a combination of latches, inverters, delay elements, XOR gates, sticky latches, and other devices including registers, scan latches, and counters in a particular architecture to detect and evaluate delays in data due to over-temperature conditions. Moreover, embodiments herein facilitate evaluation of operational parameters of a combinational logic portion, including for example evaluation of optimal operational frequency and temperature. It will be appreciated that while the foregoing has discussed delaying the clock signal to evaluate the delays of the data due to over-temperature conditions to evaluate setup time violations, the data signal may be intentionally delayed relative to the clock signal to evaluate hold time violations of the latches. Moreover, while FIG. 5 illustrates a device 500 having a native logic portion 501 integrating native combinational logic 507, the device 500 can also be a stand-alone diagnostic device having a self-generating logic portion like diagnostic portion 401 of FIG. 4.

While some embodiments herein disclose particular features and arrangements of the detection device, using the guidelines provided herein, those skilled in the art can implement the detection device and techniques in other contexts without departing from the scope of the present disclosure. Moreover, it shall be appreciated that all circuitry described herein may be implemented either in silicon or another semiconductor material or alternatively by software code representation of silicon or another semiconductor material.

What is claimed is:

1. A method comprising:
    receiving a first signal at a first combinational logic path of an integrated circuit, the first signal transitioning at a first time;
    providing a second signal from the first combinational logic path, the second signal transitioning at a second time in response to the first signal transitioning at the first time;
    latching a first latch value based on the second signal in response to a clock signal changing state at a third time;
    delaying the clock signal to create a delayed clock signal;
    latching a second latch value based on the second signal in response to the delayed clock signal changing state at a fourth time, the delayed clock signal changing state in response to the clock signal changing state at the third time; and
    determining an over-temperature condition at the integrated circuit in response to the first latch value having a different logic value than the second latch value, and asserting an error signal in response to determining an over-temperature condition.

2. The method of claim 1, wherein the first combinational logic path is part of a native logic path, the first latch value is latched at the native logic path, delaying the clock signal to create the delayed clock signal occurs at a diagnostic logic path that determines whether the native logic path is operating properly, and the second latch value is latched at the diagnostic logic path.

3. The method of claim 1, wherein delaying the clock signal comprises delaying the clock signal based on a user programmable value.

4. The method of claim 1, wherein the first combinational logic path is a diagnostic logic path.

5. The method of claim 1, wherein the first combinational logic path is a diagnostic logic path, and delaying the clock signal comprises delaying the clock signal based upon a user programmable value.

6. The method of claim 1, further comprising latching the asserted error indicator signal.

7. The method of claim 6, wherein latching the asserted error indicator signal includes latching the asserted error indicator signal at a scan latch.

8. The method of claim 6, wherein latching the asserted error indicator signal includes latching the asserted error indicator signal at a register associated with a programmer's model of the integrated circuit.

9. The method of claim 1, wherein the method further comprises maintaining the error indicator signal in response to the first latch value and the second latch value as a sticky state at a sticky latch after asserting the error indicator signal.

10. The method of claim 9, wherein the method further comprises providing a signal to clear the error indicator signal.

11. The method of claim 9, wherein the method further comprises providing an external interrupt in response to asserting the error indicator signal.

12. A device comprising:
 a first latch comprising a data input and a clock input and an output;
 a first delay path comprising combinational logic, a first input coupled to the output of the first latch, and an output;
 a second latch comprising a data input coupled to the output of the first delay path, a clock input coupled to the clock input of first latch, and an output;
 a delay element comprising an input coupled to the clock input of the first latch and an output, the delay element to delay a signal at its output by an amount that indicates the occurrence of an over-temperature condition at the first delay path;
 a third latch comprising a data input coupled to the output of the first delay path, a clock input coupled to the output of the delay element, and an output; and
 a comparator comprising a first input coupled to the output of the second latch, a second input coupled to the output of the third latch, and an output.

13. The device of claim 12, wherein the first delay path and the second latch are part of a native logic path, and the delay element and the third latch are part of a diagnostic logic path.

14. The device of claim 12, wherein the delay element is a user programmable delay element.

15. The device of claim 12, wherein the comparator comprises a XOR gate comprising a first data input coupled to the output of the second latch, a second data input coupled to the output of the third latch, and an output.

16. The device of claim 15, wherein the comparator further comprises a sticky latch comprising a data input coupled to the output of the comparator, a reset input, and an output.

17. The device of claim 16, wherein the comparator further comprises an OR gate comprising a first input coupled to the output of the sticky latch, a second data input coupled to the output of the XOR gate, and an output coupled to the data input of the sticky latch.

18. The device of claim 16, wherein the comparator comprises a counter comprising a clock input and an output coupled to a latch.

19. The device of claim 18, farther comprising:
 a second delay element comprising a data input coupled to the clock input of the first latch and an output;
 a fourth latch comprising a data input coupled to the output of the first delay path, a clock input coupled to the output of the second delay element, and an output; and
 a second comparator comprising a first input coupled to the output of the second latch, a second input coupled to the output of the fourth latch, and an output.

20. A method comprising:
 receiving a first signal at a first combinational logic path of an integrated circuit, the first signal transitioning at a first time;
 providing a second signal from the first combinational logic path, the second signal transitioning at a second time in response to the first signal transitioning at the first time;
 latching a first latch value based on the second signal in response to a clock signal changing state at a third time;
 delaying the clock signal based upon a user programmable value to create a delayed clock signal;
 latching a second latch value based on the second signal in response to the delayed clock signal changing state at a fourth time, the delayed clock signal changing state in response to the clock signal changing state at the third time; and
 determining an over-temperature condition at the integrated circuit in response to the first latch value having a different logic value than the second latch value, and asserting an error signal in response to determining an over-temperature condition.

* * * * *